Figure 1:
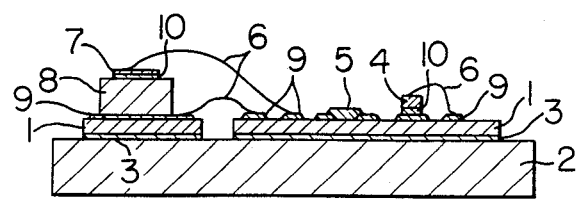

United States Patent [19]

Ogihara et al.

[11] Patent Number: 4,561,010
[45] Date of Patent: Dec. 24, 1985

[54] ELECTRICALLY INSULATING SILICON CARBIDE SINTERED BODY

[75] Inventors: Satoru Ogihara; Yukio Takeda; Kunihiro Maeda; Kousuke Nakamura; Mitsuru Ura, all of Hitachi, Japan

[73] Assignee: Hitachi, Ltd., Tokyo, Japan

[21] Appl. No.: 446,514

[22] Filed: Dec. 3, 1982

[30] Foreign Application Priority Data

Dec. 7, 1981 [JP] Japan .................... 56-197133

[51] Int. Cl.[4] .............. H01L 23/14; H01L 23/34; H01L 23/08
[52] U.S. Cl. ......................... 357/74; 357/80; 357/81; 357/67
[58] Field of Search .............. 357/81, 80, 65, 68, 357/67; 252/63 C

[56] References Cited

U.S. PATENT DOCUMENTS 4,172,109 10/1979 Smoak .................... 264/65
4,352,120 9/1982 Kurihara et al. .......... 357/81

FOREIGN PATENT DOCUMENTS 0028802 5/1981 European Pat. Off. .

Primary Examiner—Andrew J. James
Assistant Examiner—Sheila V. Clark
Attorney, Agent, or Firm—Antonelli, Terry & Wands

[57] ABSTRACT

A silicon carbide sintered body comprising silicon carbide as principal constituent, a first component for providing electrical insulating properties to said silicon carbide, said first component comprising at least one of metallic beryllium, beryllium compounds, boron and boron compounds and contained in a total amount of 0.01 to 3.5% by weight calculated as metal, and a second component which can further promote said silicon carbide sinterability provided by said first component and which does not diffuse easily in the particles of said silicon carbide, said second component comprising at least one substance selected from the Group I elements exclusive of hydrogen and francium, Group II elements exclusive of beryllium, radium and mercury, Group III elements exclusive of boron and aluminum, Group IV elements exclusive of carbon, Group V elements, Group VIa elements, Group VIIa elements Group VIII elements exclusive of iron, and compounds thereof, and contained in a total amount of 0.01 to 10% by weight, with the remainder substantially comprising silicon carbide. This silicon carbide sintered body has an electrical resistivity of $10^7 \Omega.cm$ or above at room temperature and is also excellent in electrical insulating properties and can be advantageously used as substrates for semiconductor devices, etc.

14 Claims, 3 Drawing Figures

ELECTRICALLY INSULATING SILICON CARBIDE SINTERED BODY

This invention relates to a novel electrically insulating silicon carbide sintered body, and more particularly it relates to an electrically insulating silicon carbide sintered body constituted from a high density sintered body with good heat transfer properties and suited for use as substrates for semiconductor devices.

The semiconductor industry has seen a remarkable progress in recent years and the trend is noted of the semiconductor chips being mounted with increasingly higher density on the substrates of large-scale integration circuits and the like. Progress is also underway toward smaller size and greater capacity of the integration circuits and accordingly materials with good thermal diffusivity are required for the substrates.

Hitherto, alumina sintered bodies have been popularly used as substrate material, but they cannot well meet the requirement because of their rather poor thermal diffusivity. On the other hand, the sintered body of silicon carbide is found to have a coefficient of thermal expansion of about $4 \times 10^{-6}/°C$. which is smaller than that of alumina (about $8 \times 10^{-6}/°C$.) and is approximate to that of silicon which is $3.8 \times 10^{-6}/°C$. Also, it has a thermal conductivity of 0.1 to 0.3 cal/cm.sec.°C. which is more than three times that of alumina. These property values suggest high availability of the silicon carbide sintered body as a substrate material for the semiconductor devices. Silicon carbide, however, is a material having a strong covalent bond, so that it is hard to sinter and cannot easily provide a compact sintered body. It is known that a silicon carbide sintered body of high density can be obtained by adding aluminum or iron to silicon carbide and hot pressing the mixture (Alliegro et al: J. Am. Cer. Soc., 39, 386–389 (1956)). It is also known that the high density silicon carbide sintered bodies can be obtained by using boron and carbide by means of hot pressing or pressureless sintering (U.S. Pat. No. 3,993,602) or by mixing beryllium (compound) and carbon (U.S. Pat. No. 4,172,109). There are further known silicon carbide sintered bodies obtained by adding a Group IIIa element to aluminum, boron or beryllium (compound), or by using boron, aluminum or beryllium (compound) as a sintering aid and mixing thereto barium, yttrium, zirconium, hafnium, niobium, tantalum, molybdenum, tungsten, antimony, bismuth, a lanthanum group element or an actinium group element (compound) as a grain growth inhibitor. These prior art disclosures are intended to provide materials for the heatproof structures and make no reference to the electrically insulating substrate materials.

An electrically insulating silicon carbide sintered body containing a small quantity of beryllium oxide is disclosed in U.S. Ser. No. 203,554 (1980) and European patent application No. 0028802 Al. However, sinterability of silicon carbide is very poor and more addition of beryllium oxide cannot satisfactorily improve sinterability of silicon carbide.

The present invention has for its object to provide an electrically insulating silicon carbide sintered body which is compact and further improved in sinterability without suffering any impairment of heat conductivity and electrical insulating properties.

The electrically insulating silicon carbide sintered body provided according to this invention comprises silicon carbide as its principal constituent and is characterized by incorporation of a first component which is capable of providing the electrical insulating properties to said silicon carbide while also promoting sintering thereof and a second component which can further accelerate the improvement of sinterability of silicon carbide provided by said first component and which does not diffuse easily in the particles of said silicon carbide.

Figure 2:
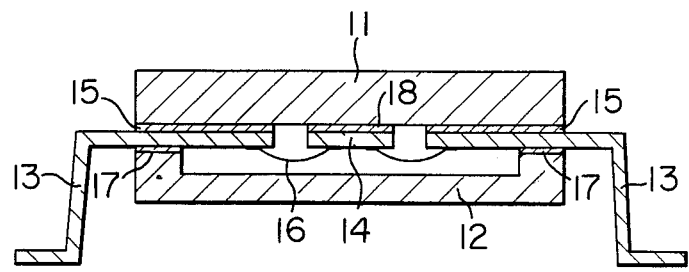
Figure 3:
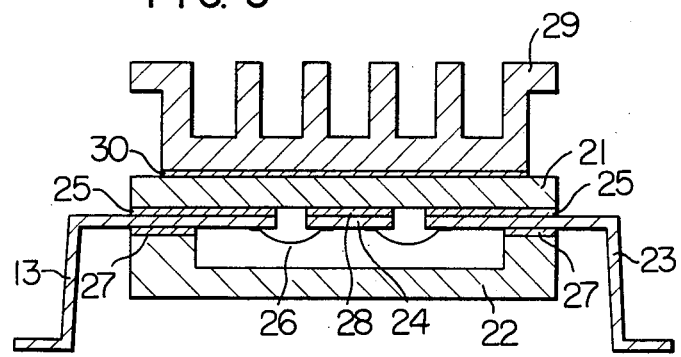

In the accompanying drawings, FIGS. 1 to 3 are sectional views of the semiconductor devices illustrating typical adaptations of the electrically insulating substrates made from the silicon carbide sintered body according to this invention.

The first component of the electrically insulating silicon carbide sintered body according to this invention comprises at least one of metallic beryllium, beryllium compounds such as beryllium oxide, beryllium carbide, beryllium nitrate, beryllium sulfide, beryllium carbonate, beryllium hydroxide, beryllium oxalic acid, etc., metallic boron and boron compounds such as boron carbide, boron nitride, boron oxide, boron acetate, etc., and such a first component is contained in the sintered body in an amount of 0.01 to 3.5% by weight in all. Beryllium oxide is preferred among said beryllium compounds and boron nitride is most recommendable among said boron compounds.

A single crystal of silicon carbide has a thermal conductivity as high as 1.0 cal/cm.sec.°C. at room temperature, and it is known that, among the inorganic materials, silicon carbide is the second highest in thermal conductivity next to diamond. In metals, heat transfer is effected by the action of free electrons, whereas in the inorganic materials, it is caused by movement of phonons resulting from lattice vibration. Therefore, thermal conductivity of silicon carbide is deteriorated if the single crystals thereof are contaminated by the impurities to disturb the lattice vibration. Accordingly, the additives diffused in the silicon carbide particles during sintering are detrimental to thermal conductivity. For instance, aluminum, iron or compounds thereof, which have been considered very effective as sintering aid, are now found acting to reduce thermal conductivity of the sintered body because such a substance is diffused in the particles of silicon carbide during sintering thereof to disarrange the crystal lattices. It is also known that mixing of substance in the crystal lattice results in a reduced electrical insulating performance of the sintered body as such mixing invites an increase of the carrier to promote electric conduction in the crystal particles.

It is also noted that the more compact and the less porous is the sintered body, there is less scattering of phonons in the pores and at the grain boundaries, resulting in better thermal conductivity.

As for the second component which is used for further enhancing the sinterability of silicon carbide provided by the first component and which does not diffuse easily in the particles of silicon carbide, the second component may comprise one or more substances selected from the Group I elements exclusive of hydrogen and francium, Group II elements exclusive of beryllium, radium and mercury, Group III elements exclusive of boron and aluminum, Group IV elements exclusive of carbon, Group V elements, Group VIa elements, Group VIIa elements, Group VIII elements exclusive of iron and compounds of these elements. Preferably, such second component is composed of one or more of the following elements: lithium, sodium, potassium, rubidium, cesium, magnesium, calcium, strontium, barium, radium, scandium, yttrium, lanthanum, cerium, praseodymium, neodium, samarium, gadolinium, dysprosium, ytterbium, lutetium, actinium, thorium, titanium, zirconium, hafnium, chromium, molybdenum, tungsten, manganese, technetium, rhenium, neptunium, ruthenium, osmium, rhodium, iridium, americium, palladium, platinum, cobalt, nickel, copper, silver, gold, zinc, cadmium, gallium, indium, thallium, germanium, tin, lead and compounds thereof. These metals and compounds thereof do not diffuse easily in the silicon carbide particles, and thus they are scarcely diffused in the silicon carbide crystals and stay substantially unchanged in their properties during the sintering process. It is, however, impossible to obtain a high density sintered body by merely mixing one or more of these elements and their compounds with silicon carbide and sintering the mixture. Further addition of beryllium, especially beryllium oxide, to said metal(s) or compound(s) thereof can provide a compact, electrically insulating sintered body with high thermal conductivity.

The content of said second component should be within the range of 0.01 to 10% by weight in total. The content of at least 0.01% by weight is necessary for satisfactorily enhancing sinterability of silicon carbide to provide a high thermal conductivity. In order to prevent the element(s) or compound(s) thereof from getting in between the silicon carbide particles and impairing the heat conductivity, the content of the second component needs to be not greater than 10% by weight.

The amount of beryllium oxide is preferably from 0.05 to 10% by weight. An amount of not less than 0.05% by weight is desired for sufficiently promoting sintering of silicon carbide to provide high thermal conductivity and high strength. On the other hand, for obtaining sufficiently high resistance against break by heat shock after mixing and sintering of the silicon carbide particles having a coefficient of thermal expansion smaller than $4 \times 10^{-6}/°C$. and beryllium oxide with a greater coefficient of thermal expansion, it is desirable that the amount of beryllium oxide added is not greater than 10% by weight.

The principal object of the study of the silicon carbide sintered bodies has been the development of the materials with high strength at high temperatures by making use of prominent heat resistance of the sintered bodies. However, such high temperature strength is not necessarily required in case the sintered bodies are used as substrates for semiconductor elements by taking advantage of their high heat conductivity. Accordingly, the additives mixed in silicon carbide may contain the low-melting materials.

Addition of beryllium (especially beryllium oxide) alone to silicon carbide may provide a sintered body of high density and high thermal conductivity depending on the sintering conditions. But, further addition of the second component allows obtainment of a sintered body with greatly improved electrical insulating properties since the addition of such a second component further facilitates sintering of silicon carbide to arrest growth of the particles of the sintered body, resulting in the reduced particle size and an increased number of particle-particle boundaries and a corresponding increase of the electrical boundary barriers. The resulting sintered body also has high break strength.

The silicon carbide sintered body of this invention is provided with even higher electrical insulating capacity owing to use of starting silicon carbide powder containing, as impurities, less than 0.5% by weight of free carbon, less than 0.1% by weight of aluminum and less than 1% by weight of free silicon.

Because of its high thermal conductivity (higher than that of aluminum) and electrical insulating performance, the silicon carbide sintered body according to this invention is very useful as substrates for the electrical devices. Especially, owing to its excellent heat diffusivity, it finds best application to the semiconductor devices where heat dissipation is required, particularly the substrates of the power semiconductor devices and high density semiconductor devices.

The invention will be illustrated in greater detail by way of the following specific Examples.

EXAMPLE 1

A silicon carbide power with an average particle size of 2 μm and having a chemical composition shown in Table 1 was mixed with each of the powder specimens shown in Table 2 having a particle size of 1 μm or less, and each mixture was shaped into a molding under a pressure of 1,000 Kg/cm² at room temperature. Each molding thus formed was placed in a graphite die and hot pressed in a vacuum of $1 \times 10^{-5}$ to $1 \times 10^{-3}$ Torr. Hot pressing was conducted under a pressure of 300 Kg/cm² by heating from room temperature to 2,000° C. in about 2 hours. After one-hours standing at 2,000° C., the heating power source was cut off to effect cooling of the molding.

Properties of the resultantly obtained sintered bodies are shown in Table 2. In the table, Specimen Nos. 1–16, 18–26, 28–32, 34–37, 41–43, and 45–57 are the sintered bodies according to this invention, and Specimen Nos. 17, 27, 33, 38–40 and 44 are the sintered bodies produced for the comparative purpose. Specimen No. 1 showed a relative density of 98%, a thermal conductivity of 0.5 (cal/cm.sec.°C.) at room temperature, an average coefficient of thermal expansion of $3.4 \times 10^{-6}/°C$. at temperatures between room temperature and 300° C., and an electrical resistivity above $10^{10}$ Ω.cm at room temperature. The specimens mixed with Al₂O₃, such as Specimen No. 17, showed a low thermal conductivity (0.2 cal/cm.sec.°C.), while the specimen with a very small content of beryllium oxide (BeO), such as Specimen Nos. 27 and 33, were low in relative density and thermal conductivity and also extremely low in electrical resistivity (10⁴ Ω.cm) at room temperature. Specimen Nos. 38, 39 and 40 containing no beryllium oxide were either low in relative density or low in thermal conductivity (0.2 cal/cm.sec.°C. or below), and Specimen Nos. 38 and 40 showed a low electrical resistivity (10⁴ Ω.cm or lower) at room temperature. Specimen No. 39 which contains BN showed an electrical resistivity of 10¹⁰ Ω.cm at room temperature, indicating possession of electrical insulating property. The specimens with a BeO content in excess of 10%, such as Specimen No. 37, although high in relative density, have a coefficient of thermal expansion in excess of $4.0 \times 10^{-6}/°C$., so that such specimens seem rather unsuited for use as substrates for Si semiconductor devices. Also, because of a high impurity content under this sintering conditions, such specimens are rather low in thermal shock resistance and vulnerable to breakage. The sintered bodies according to this invention exhibit a relative density of 90% or more and also showed an electrical resistivity above $10^{10}$ Ω.cm at room temperature and a thermal conductivity higher than 0.3 cal/cm.sec.°C. at room temperature. The relative density shown in the table is the percent to the theoretical density of silicon carbide in the sintered body. The coefficient of thermal expansion given in the table is the mean of the values determined at temperatures between room temperature and 300° C.

The sintering was conducted under the same conditions as mentioned above except that some specimens of this invention as shown in Table 2 were sintered at 1900° C. As a result, those containing BeO in an amount of more than 0.1% by weight showed almost the same relative density of 90% or more, thermal conductivity of 0.4 cal/cm.sec.°C. or more and electrical resistivity of $10^{10}$ ohm.cm or more as those obtained by sintering at 2000° C.

TABLE 1

| | Weight (%) | | | (ppm) | | | | | | | | | | | | |
|---|---|---|---|---|---|---|---|---|---|---|---|---|---|---|---|---|
| SiC | Free C | $SiO_2$ | Free Si | B | Mg | Al | Ca | Ti | V | Cr | Mn | Fe | Co | Ni | Zn | Na |
| 97.6 | 0.08 | 1.4 | 0.57 | 17 | 17 | 87 | 51 | 1290 | 540 | 150 | 7 | 650 | 11 | 240 | 1 | 90 |

TABLE 2

| Specimen No. | Composition | | | Properties | | |
|---|---|---|---|---|---|---|
| | Amount of SiC (wt %) | Amount added Component/amount (wt. %) | Amount of BeO (wt. %) | Relative density (%) | Thermal conductivity Cal/cm · s · °C. | Coefficient of thermal expansion × $10^{-6}$/°C. |
| 1 | 98 | MgO/1.0 | 1.0 | 98 | 0.5 | 3.4 |
| 2 | 98 | CaO/1.0 | 1.0 | 98 | 0.4 | 3.4 |
| 3 | 97 | MgO/1.0, $Y_2O_3$/1.0 | 1.0 | 99 | 0.5 | 3.6 |
| 4 | 98 | $ZrO_2$/1.0 | 1.0 | 99 | 0.4 | 3.4 |
| 5 | 97 | $TiO_2$/1.0 | 1.0 | 98 | 0.4 | 3.4 |
| 6 | 98 | $Nb_2O_5$/1.0 | 1.0 | 98 | 0.5 | 3.4 |
| 7 | 98 | $Cr_2O_3$/1.0 | 1.0 | 99 | 0.5 | 3.4 |
| 8 | 98 | $MnO_2$/1.0 | 1.0 | 99 | 0.6 | 3.4 |
| 9 | 97 | $Ta_2O_5$/1.0, W/1.0 | 1.0 | 99 | 0.5 | 3.5 |
| 10 | 98 | Mo/1.0 | 1.0 | 98 | 0.5 | 3.4 |
| 11 | 98 | CoO/1.0 | 1.0 | 98 | 0.4 | 3.5 |
| 12 | 98 | NiO/1.0 | 1.0 | 99 | 0.4 | 3.5 |
| 13 | 98 | PdO/1.0 | 1.0 | 99 | 0.4 | 3.5 |
| 14 | 98 | Ag/0.5, MgO/0.5 | 1.0 | 96 | 0.5 | 3.5 |
| 15 | 98 | ZnO/1.0 | 1.0 | 98 | 0.3 | 3.5 |
| 16 | 98 | CdO/0.5, BaO/0.5 | 1.0 | 99 | 0.4 | 3.5 |
| 17 | 98 | $Al_2O_3$/1.0 | 1.0 | 98 | 0.2 | 3.5 |
| 18 | 98 | $In_2O_3$/1.0 | 1.0 | 96 | 0.4 | 3.5 |
| 19 | 98 | $SiO_2$/1.0 | 1.0 | 98 | 0.5 | 3.5 |
| 20 | 98 | $SnO_2$/1.0 | 1.0 | 98 | 0.4 | 3.5 |
| 21 | 98 | $Sb_2O_3$/1.0 | 1.0 | 99 | 0.5 | 3.4 |
| 22 | 98 | $Bi_2O_3$/1.0 | 1.0 | 98 | 0.4 | 3.5 |
| 23 | 98 | $ZrSiO_4$/1.0 | 1.0 | 99 | 0.4 | 3.5 |
| 24 | 98 | $CeO_2$/1.0 | 1.0 | 99 | 0.5 | 3.5 |
| 25 | 98 | $La_2O_5$/1.0 | 1.0 | 99 | 0.4 | 3.5 |
| 26 | 98 | $Li_2O_5$/1.0 | 1.0 | 98 | 0.5 | 3.5 |
| 27 | 98.995 | MgO/1.0 | 0.01 | 60 | 0.03 | 3.4 |
| 28 | 99.49 | MgO/0.5 | 0.05 | 93 | 0.3 | 3.4 |
| 29 | 99.6 | MgO/0.5 | 0.1 | 95 | 0.4 | 3.5 |
| 30 | 94.5 | MgO/0.5 | 5 | 99 | 0.6 | 3.7 |
| 31 | 80.5 | MgO/0.5 | 10 | 99 | 0.6 | 4.0 |
| 32 | 86.5 | MgO/0.5 | 13 | 99 | 0.4 | 4.2 |
| 33 | 98.995 | $Y_2O_3$/1.0 | 0.01 | 63 | 0.05 | 3.5 |
| 34 | 98.9 | $Y_2O_3$/1.0 | 0.1 | 90 | 0.4 | 3.5 |
| 35 | 94 | $Y_2O_3$/1.0 | 5 | 99 | 0.5 | 3.7 |
| 36 | 89 | $Y_2O_3$/1.0 | 10 | 99 | 0.5 | 3.9 |
| 37 | 86 | $Y_2O_3$/1.0 | 13 | 99 | 0.4 | 4.3 |
| 38 | 98 | MgO/2.0 | 0 | 55 | — | — |
| 39 | 98 | BN/2.0 | 0 | 98 | 0.12 | 3.4 |
| 40 | 98 | AlN/2.0 | 0 | 99 | 0.2 | 3.5 |
| 41 | 97 | MgO/0.5, $TiO_2$/0.5 | 2.0 | 98 | 0.4 | 3.6 |
| 42 | 97 | $Y_2O_3$/0.5, $ZrO_2$/0.5 | 2.0 | 99 | 0.5 | 3.5 |
| 43 | 97 | CaO/0.5, BaO/0.5 | 2.0 | 99 | 0.6 | 3.6 |
| 44 | 97 | $Al_2O_3$/0.5, BaO/0.5 | 2.0 | 99 | 0.2 | 3.5 |
| 45 | 98 | MgO/0.5, $ZrO_2$/0.5 | 1.0 | 99 | 0.5 | 3.5 |
| 46 | 98 | MgO/0.5, $Y_2O_3$/0.5 | 1.0 | 99 | 0.6 | 3.5 |
| 47 | 98 | MgO/0.5, $CeO_2$/0.5 | 1.0 | 99 | 0.5 | 3.5 |
| 48 | 98 | $Cr_2O_3$/0.5, $Y_2O_3$/0.5 | 1.0 | 98 | 0.5 | 3.5 |
| 49 | 98 | $Cr_2O_3$/0.5, $Gd_2O_3$/0.5 | 1.0 | 99 | 0.5 | 3.5 |
| 50 | 98 | $Cr_2O_3$/0.5, W/0.5 | 1.0 | 96 | 0.4 | 3.4 |
| 51 | 97.5 | MgO/0.5, $TiO_2$/0.5, $ZrO_2$/0.5 | 1.0 | 98 | 0.5 | 3.5 |
| 52 | 97.5 | $Y_2O_3$/0.5, $ZrO_2$/0.5, $SiO_2$/0.5 | 1.0 | 98 | 0.5 | 3.6 |
| 53 | 97.5 | $Sm_2O_3$/0.5, $ZrO_2$/0.5 CoO/0.5 | 1.0 | 99 | 0.5 | 3.6 |

TABLE 2-continued

| Specimen No. | Composition | | | Properties | | |
|---|---|---|---|---|---|---|
| | Amount of SiC (wt %) | Amount added Component/amount (wt. %) | Amount of BeO (wt. %) | Relative density (%) | Thermal conductivity Cal/cm · s · °C. | Coefficient of thermal expansion × $10^{-6}$/°C. |
| 54 | 97.5 | BaO/0.5, $Sc_2O_3$/0.5, Pt/0.5 | 1.0 | 98 | 0.5 | 3.6 |
| 55 | 97 | $Rb_2O$/0.5, BaO/0.5, $La_2O_3$/0.5, $Bi_2O_3$/0.5 | 1.0 | 98 | 0.5 | 3.7 |
| 56 | 97 | BaO/0.5, $Ac_2O_3$/0.5, PbO/0.5, $SnO_2$/0.5, $Bi_2O_3$/0.5, $MnO_2$/0.5 | 1.0 | 97 | 0.4 | 3.7 |
| 57 | 96.5 | $Cr_2O_3$/0.5, $Sb_2O_3$/0.5, $SiO_2$/0.5 | 1.0 | 98 | 0.4 | 3.8 |

EXAMPLE 2

A silicon carbide powder of the same chemical composition as shown in Table 1 but having an average particle size of 0.5 μm was mixed with some of the specimen compositions of this invention shown in Table 2 and each mixture was molded similarly to Example 1 under a pressure of 1,000 Kg/cm$^2$, and each of the moldings thus obtained was sintered in an argon atmosphere at 2,100° C. for one hour. The resultantly obtained sintered bodies had their surfaces composed of rather coarse particles due to a somewhat advanced degree of growth of the SiC particles as compared with the sintered bodies of Example 1, but the coarse particle portions were removed by grinding. These sintered bodies showed a relative density above 90%. In comparison with the corresponding specimens of Example 1, they were improved in relative density and showed a thermal conductivity above 0.4 and a coefficient of thermal expansion of the order of 3.5 to 4.0×$10^{-6}$/°C. As in the case of Example 1, the sintered bodies showing a relative density above 90% had an electrical resistivity $10^{10}$ Ω.cm or more at room temperature.

EXAMPLE 3

FIG. 1 is a sectional view illustrating a silicon semiconductor device using a silicon carbide sintered body according to this invention. The sintered body is of the composition of Specimen No. 1 in Table 1 produced according to the process of Example 1. To the underside of the insulating substrate 1 made of said SiC sintered body is secured a radiation fin 2 made of a metal such as copper by means of a solder layer 3, and above said substrate 1 are provided a transistor pellet 4, a thick-film resistance 5 and a power transistor pellet 7 disposed on a metallic heat sink 8. Said transistor pellet 4 is connected to a circuit conductor 9 by a bonding wire 6 formed from a fine metal wire. The semiconductor devices using the insulating substrate 1 made of a silicon carbide sintered body of this invention have excellent heat dispersibility owing to the high thermal conductivity of the substrate and are thus capable of increasing the capacity or integration density of the respective elements. The power transistor pellet 7 is joined to a metal-made heat sink 8 by a metallic solder 10 and also connected to a circuit conductor 9 provided on the substrate 1.

Because its coefficient of thermal expansion is approximate to that of silicon chips, the substrate of this invention allows direct joining of a large-sized chip by a metal which has been impossible with the conventional alumina substrates. Also, because of its excellent thermal and mechanical properties, the substrate of this invention can maintain sufficient strength against various thermal and mechanical changes incidental to soldering, welding and other works during manufacture of, for example, an electrical device, and is also capable of well withstanding heat cycling or thermal distortion resulting from a rise of temperature in operation of said electrical device, thus ensuring high reliability of the electrical device.

It also falls within the scope of this invention to coat the substrate surface with a heat oxidation film or with alumina or silicon nitrate as insulating layer, or to apply an insulating resin layer such as a polyimide film. In these cases, however, it is imperative to arrest formation of voids to a maximal degree.

FIGS. 2 and 3 illustrate, in sectional views, the arrangement plans of other examples of semiconductor devices using the sintered body of this invention shown in FIG. 1 as their substrate 11 and 21, respectively. Each example is adapted with LSI circuits, and in each case, the semiconductor element 14, 24 is directly joined to the substrate 11, 21 made of the sintered body of this invention by means of metal solder 18, 28 with no Mo intermediate. The semiconductor element 14, 24 is connected to the lead frames 13, 23 which connect to the external circuits by bonding wires 16, 26 made of a fine metal wire. These semiconductor element 14, 24, bonding wires 16, 26, and part of lead frames 13, 23 are shut off from the outer air by a cap 12, 22 made of a ceramic material, especially alumina porcelain. The substrate 11, 21 and lead frames 13, 23, and the lead frames 13, 23 and cap 12, 22 are joined by seal glass 15, 17, 25, 27. The semiconductor device of FIG. 3 is provided with a radiation fin 29 made of a metal, especially aluminum. This radiation fin 29 is joined to the substrate by a heat-resistant epoxy resin 30.

As described above, the substrate made of the silicon carbide sintered body of this invention has high thermal conductivity, and hence the devices using such substrate have excellent heat dispersibility, and especially when such substrate is applied to the semiconductor devices, it provides an appreciable increase of capacity or integration density of the semiconductor elements.

What is claimed is:

1. An electrically insulating silicon carbide sintered body having an electrical resistivity of $10^7$ Ω.cm or above at room temperature, comprising silicon carbide as a principal component, a first component for providing an electrical insulating quality to said silicon carbide, and first component consisting essentially of at least one of metallic beryllium, beryllium compounds, boron and a boron compounds and being contained in said body in a total amount of 0.01 to 3.5% by weight calculated, respectively, as beryllium or boron and a second component which can further promote the sinterability provided to said silicon carbide by said first component and which does not diffuse easily into particles of said silicon carbide, the second component consisting essentially of at least one member selected from the group consisting of the elements in Groups I, II, III, IV, V, VIa, VIIa or VIII of the Periodic Table, other than hydrogen, francium, beryllium, radium, mercury, boron, aluminum, carbon, and iron, and compounds of said elements, said second component being contained in said body in a total amount of 0.01 to 10% by weight with the balance of said body consisting essentially of said silicon carbide.

2. An electrically insulating silicon carbide sintered body according to claim 1, wherein said second component comprises at least one member selected from the group consisting of sodium, sodium compounds, potassium, potassium compounds, rubidium, rubidium compounds, cesium, cesium compounds, magnesium, magnesium compounds, calcium, calcium compounds, strontium, strontium compounds, barium, barium compounds, radium, radium compounds, scandium, scandium compounds, yttrium, yttrium compounds, lanthanum, lanthanum compounds, cerium, cerium compounds, praseodymium, praseodymium compounds, neodium, neodium compounds, samarium, samarium compounds, gadolinium, gadolinium compounds, dysprosium, dysprosium compounds, ytterbium, ytterbium compounds, lutetium, lutetium compounds, actinium, actinium compounds, thorium, thorium compounds, titanium, titanium compounds, zirconium, zirconium compounds, hafnium, hafnium compounds, chromium, chromium compounds, molybdenum, molybdenum compounds, tungsten, tungsten compounds, manganese, manganese compounds, technetium, technetium compounds, rhenium, rhenium compounds, neptunium, neptunium compounds, ruthenium, ruthenium compounds, osmium, osmium compounds, rhodium, rhodium compounds, iridium, iridium compounds, americium, americium compounds, palladium, palladium compounds, platinum, platinum compounds, cobalt, cobalt compounds, nickel, nickel compounds, copper, copper compounds, silver, silver compounds, gold, gold compounds, zinc, zinc compounds, cadmium, cadmium compounds, gallium, gallium compounds, indium, indium compounds, thallium, thallium compounds, germanium, germanium compounds, tin, tin compounds, lead and lead compounds.

3. An electrically insulating silicon carbide sintered body according to claim 2, wherein said compounds are oxides.

4. An electrically insulating silicon carbide sintered body according to claim 1, wherein the content of said silicon carbide is 90% by weight or more of the sintered body.

5. An electrically insulating silicon carbide sintered body according to claim 1, wherein said sintered body has a density which is 90% or more of theoretical.

6. An electrically insulating silicon carbide sintered body according to claim 1, wherein said beryllium compound is beryllium oxide and said boron compound is boron nitrate.

7. An electrical device comprising a circuit element mounted on an electrically insulating substrate, made of an electrically insulating silicon carbide sintered body having an electrical resistivity of $10^7$ $\Omega$.cm or above at room temperature, comprising silicon carbide as a principle component, a first component for providing an electrical insulating quality to said silicon carbide, and first component consisting essentially of at least one of metallic beryllium, beryllium compounds, boron and a boron compounds and being contained in said body in a total amount of 0.01 to 3.5% by weight calculated, respectively, as beryllium or boron and a second component which can further promote the sinterability provided to said silicon carbide by said first component and which does not diffuse easily into particles of said silicon carbide, the second component consisting essentially of at least one member selected from the group consisting of the elements in Groups I, II, III, IV, V, VIa, VIIa or VIII of the Periodic Table, other than hydrogen, francium, beryllium, radium, mercury, boron, aluminum, carbon, and iron, and compounds of said elements, said second component being contained in said body in a total amount of 0.01 to 10% by weight with the balance of said body consisting essentially of said silicon carbide.

8. An electrical device according to claim 7, wherein said circuit element comprises at least one of semiconductor element, thick-film resistor and circuit conductor.

9. An electrical device according to claim 7, wherein said substrate is disposed on a radiation fin made of a metal.

10. An electrical device according to claim 8, wherein said semiconductor element is mounted on a heat sink made of a metal and said heat sink is mounted on said substrate.

11. An electrical device according to claim 7, wherein said circuit element is shut off from the atmospheric air by a sealing member.

12. An electrical device according to claim 11, wherein said sealing member is a cap made of a ceramic material.

13. A semiconductor device comprising a semiconductor element mounted on an electrically insulating substrate, said semiconductor element being connected to lead frames by ultra-fine metal wire, said semiconductor element, said ultra-fine wire and part of said lead frames being sealed by a ceramic cap, wherein said substrate is formed of an electrically insulating silicon carbide sintered body having an electrical resistivity of $10^7$ $\Omega$.cm or above at room temperature, comprising silicon carbide as a principal component, a first component for providing an electrical insulating quality to said silicon carbide, and first component consisting essentially of at least one of metallic beryllium, beryllium compounds, boron and a boron compounds and being contained in said body in a total amount of 0.01 to 3.5% by weight calculated, respectively, as beryllium or boron and a second component which can further promote the sinterability provided to said silicon carbide by said first component and which does not diffuse easily into particles of said silicon carbide, the second component consisting essentially of at least one member selected from the group consisting of the elements in Groups I, II, III, IV, V, VIa, VIIa or VIII of the Periodic Table, other than hydrogen, francium, beryllium, radium, mercury, boron, aluminum, carbon, and iron, and compounds of said elements, said second component being contained in said body in a total amount of 0.01 to 10% by weight with the balance of said body consisting essentially of said silicon carbide the electrically insulating semiconductor carbide sintered body of claim 1.

14. An semiconductor device according to claim 13, wherein said substrate is disposed on a radiation fin made of a metal.

* * * * *